United States Patent
Milic-Strkalj et al.

[11] Patent Number: 6,080,630
[45] Date of Patent: Jun. 27, 2000

[54] METHOD FOR FORMING A MOS DEVICE WITH SELF-COMPENSATING $V_T$-IMPLANTS

[75] Inventors: Ognjen Milic-Strkalj, Burlingame; Richard Rouse, San Francisco; Zoran Krivokapic, Santa Clara, all of Calif.

[73] Assignee: Advanced Micro Devices, Inc., Sunnyvale, Calif.

[21] Appl. No.: 09/243,014

[22] Filed: Feb. 3, 1999

[51] Int. Cl.[7] .................................. H01L 21/336
[52] U.S. Cl. ........................... 438/305; 438/303
[58] Field of Search .................... 438/289, 290, 438/291, 545, 301, 303, 305, 306, 307, 595

[56] References Cited

U.S. PATENT DOCUMENTS 5,466,957  11/1995  Yuki et al. .............................. 257/344

OTHER PUBLICATIONS

Okamura, K., Shirahata, M., Okudaira, T., Hachisuka, A., Arima, H., Matsukawa, T., and Tsubouchi, N., "A Novel Source–to–Drain Nonuniformly Doped Channel (NUDC) MOSFET for High Current Drivability and Threshold Voltage Controllability", IEDM 90, pp. 391–394.

*Primary Examiner*—Charles Bowers
*Assistant Examiner*—Jack Chen
*Attorney, Agent, or Firm*—Mikio Ishimaru

[57] ABSTRACT

The present invention provides a method for forming a MOS device having self-compensating threshold adjust implants and reduced junction capacitance. A semiconductor substrate of a first conductivity type is provided. A gate oxide is formed on the surface of the semiconductor substrate, and a polysilicon gate is formed on the surface of the gate oxide. A first implant of a dopant of the first conductivity type is performed so as to form self-compensating implant regions in the semiconductor substrate on opposite sides of the gate. Disposable sidewall spacers are then formed around the polysilicon gate. A second implant of a dopant of a second conductivity type is performed so as to create highly-doped source/drain regions which are self-aligned to the sidewall spacers. The substrate with self-compensating implant regions and the highly-doped source/drain regions is then subject to a rapid thermal anneal (RTA) process so as to activate the dopant in the self-compensating implant regions and the highly-doped source/drain regions. The dopant within the self-compensating regions diffuses laterally under the polysilicon gate to define pockets. Thereafter, the disposable sidewall spacers are removed. Finally, a third implant of a dopant of the second conductivity type is performed so as to create lightly-doped source/drain regions in the self-compensating implant regions on opposite sides of the gate.

18 Claims, 7 Drawing Sheets

METHOD FOR FORMING A MOS DEVICE WITH SELF-COMPENSATING $V_T$-IMPLANTS

CROSS REFERENCE TO RELATED APPLICATION

The present application contains subject matter relating to a co-pending U.S. patent application entitled "A MOS Device With Self-Compensating $V_T$-Implants", by Ognjen Milic-Strkalj and Geoffrey Choh-Fei Yeap. This application was filed on Oct. 14, 1997, is assigned to the same assignee as the present application, is identified by Ser. No. 08/949,959, and is hereby incorporated by reference.

TECHNICAL FIELD

This invention relates generally to a method of manufacturing a semiconductor device and more particularly, it relates to an improvement of a method of manufacturing a metal oxide semiconductor (MOS) device which includes self-compensating threshold adjust implants.

BACKGROUND ART

As is generally well known in the art, a semiconductor device having a stacked structure of metal-insulator-semiconductor is referred to as a MIS semiconductor device. A transistor which uses an oxide film as the insulator is referred to as Metal Oxide Semiconductor Field Effect Transistor (MOSFET). A typical MOSFET structure includes a pair of source/drain regions (n-type for an N-MOSFET or p-type for a P-MOSFET) formed on a surface of a silicon substrate, a gate oxide film formed on the substrate between the source/drain regions, and a gate electrode formed on the surface of the gate oxide film. The surface area of the substrate between the source region and the drain region is defined as a channel region. The length of the channel region is the distance between the source/drain regions, which is typically somewhat shorter than the gate length.

The threshold voltage $V_T$ for the MOSFET device is defined to be the gate-to-source voltage $V_{gs}$ applied across the gate and source electrodes, below which the MOS device drain-to-source current $I_{ds}$ becomes near zero. However, this threshold voltage is a function of a number of parameters, which includes the gate material, the gate insulation material, the gate insulation thickness, the channel doping, the impurities at the silicon-insulator interface, and the source-to-substrate voltage between the source and substrate.

In order to increase the speed of the MOS device, there exists a continuing trend of scaling-down the structure to smaller sizes. One of the ways of scaling is by reducing the length of the gate. However, one of the most pronounced effects occurs due to the gate length reduction is the loss of gate electrode control which is sometimes referred to as threshold ($V_T$) roll-off. In the classical VLSI circuit design where a very large number of MOSFET devices are fabricated on a plurality of semiconductor integrated circuit dies or chips on a wafer, the distribution of the actual gate length across the wafer will vary due to inescapable process variations. Since the threshold voltage is a function of the gate length, this will also cause the threshold voltages of the various MOS devices on the wafer to be subjected to a wide degree of fluctuation. As a result, the yield for such MOS devices during production will be greatly reduced.

There are known techniques for threshold adjusts which exist in the prior art. For example, in an article entitled "A Novel Source-to-Drain Nonuniformly Doped Channel (NUDC) MOSFET for High Current Drivability and Threshold Voltage Controllability" and authored by Y. Okumura et al., IEDM 90, pp. 391–394, there is described a method of a MOSFET fabrication where the concentration of the channel near the source and drain is increased to suppress the widening of the depletion region and the concentration in the middle of the channel is decreased so as to increase mobility.

In U.S. Pat. No. 5,466,957 issued on Nov. 14, 1995, to Yuki et al., there is disclosed a semiconductor device which includes a substrate of a first conductivity type, a gate electrode laminated thereon, and source/self-aligned manner in an upper portion of the substrate outside the gate electrode. A high concentration layer of the first conductivity type is formed in a channel region between the source and drain regions. A low conductivity layer of the first conductivity type is formed between the high conductivity layer and the source/drain regions.

There is also known in the prior art a technique for controlling the threshold distribution by threshold adjust implant (channel doping at the silicon-insulation interface) prior to the deposition of the gate polysilicon.

Generally, the prior art techniques for threshold adjust also suffer from the disadvantages of requiring high energy and high-tilt angle implants. Accordingly, there exists a need for a method for forming MOS devices which have a minimal threshold fluctuation across the semiconductor wafer so as to improve its yield, but yet permits the ability to use low energy and low-tilt angle implants.

DISCLOSURE OF THE INVENTION

The present invention provides an improved method of manufacturing a MOS device which includes self-compensating threshold adjust implants.

The present invention further provides a method for fabricating MOS devices which has a minimal threshold fluctuation across the semiconductor wafers so as to improve yield.

The present invention also provides a method for fabricating MOS devices which utilizes low energy and low-tilt angle implants.

The present invention further provides a method for fabricating MOS devices which allows automatic tracking of channel doping in the substrate so as to increase and decrease the doping as the gate length is varied.

The present invention still further provides a method for fabricating MOS devices which minimizes the vertical diffusion of channel doping so as to minimize the increase in junction capacitance.

In accordance with a preferred embodiment of the present invention, there is provided a MOS device having self-compensating threshold adjust implants and a method of fabricating the same. A semiconductor substrate of a first conductivity type is provided. A gate oxide is formed on the surface of the semiconductor substrate, and a polysilicon gate is formed on the surface of the gate oxide.

A first implant of a dopant of the first conductivity type is performed so as to form self-compensating implant regions in the semiconductor substrate on opposite sides of the gate. Disposable sidewall spacers are then formed around the polysilicon gate. A second implant of a dopant of the second conductivity type is performed so as to create highly-doped source/drain regions which are self-aligned to the sidewall spacers. The substrate with self-compensating implant regions and the highly-doped source/drain regions is then subject to a rapid thermal anneal (RTA) process so as to activate the dopant in the self-compensating implant regions and the highly-doped source/drain regions. The dopant within the self-compensating regions diffuses laterally under the polysilicon gate to define pockets. Thereafter, the sidewall spacers are removed. Finally, a third implant of a dopant of the second conductivity type is performed so as to create lightly-doped source/drain regions in the self-compensating implant regions on opposite sides of the gate.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
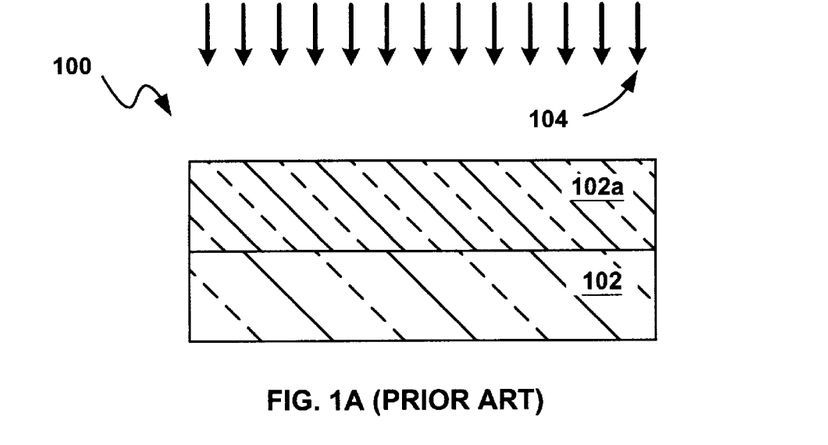
FIGS. 1A (PRIOR ART) through 1F (PRIOR ART) illustrate the sequence of process steps of a conventional process for forming a MOS device on a semiconductor substrate.

FIGS. 1A (PRIOR ART) through 1F (PRIOR ART) illustrate the sequence of process steps of a conventional process for forming a MOS device on a semiconductor substrate.

This conventional process involves using a prior art technique for controlling the threshold distribution by threshold adjust implant (channel doping at the silicon-insulation interface) prior to the deposition of the gate polysilicon.

Referring now to FIG. 1A (PRIOR ART), therein is shown a cross-section of a semiconductor 100 in an intermediate stage of processing. At this stage is shown a silicon substrate 102, which may be of a first conductivity type in which a threshold adjust implant, represented by the solid vertical lines 104 of a dopant, penetrates into the substrate 102 at an incidence angle of 7° so as to form a higher concentration layer 102a of the first conductivity type. For an NMOS device, the dopant is of the same first conductivity type such as boron (B) or boron fluoride ($BF_2$) while for a PMOS device the dopant is arsenic (As) or phosphorus (P). Typically, the impurity is doped in a dose of approximately $8 \times 10^{12}$ ions/cm$^2$ and at an energy of 5–15 KeV.

Figure 1B:
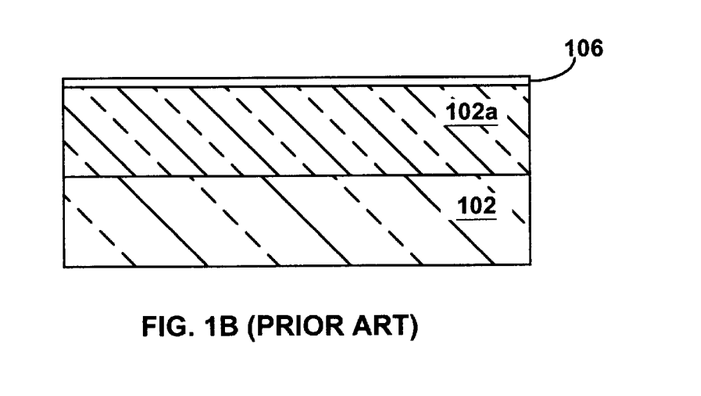

Referring now to FIG. 1B (PRIOR ART), therein is shown the silicon substrate 102 with a layer of a gate oxide 106 formed on the surface of the higher concentration layer 102a.

Figure 1C:
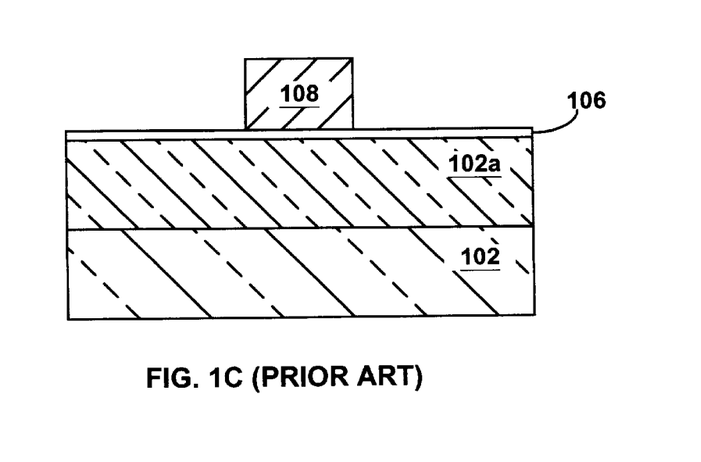

Referring now to FIG. 1C (PRIOR ART), therein is shown the silicon substrate 102 after the conventional step of polysilicon deposition and polysilicon gate pattern and etch to form a polysilicon gate 108 on the silicon substrate 102 over the gate oxide 106.

Figure 1D:
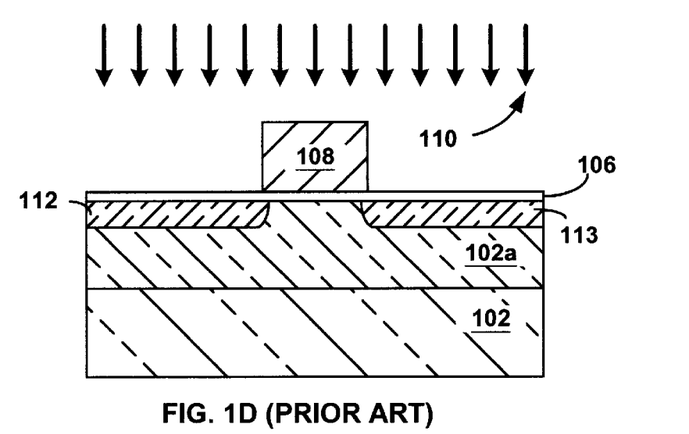

Referring now to FIG. 1D (PRIOR ART), therein is shown the ion implantation 110 of a dopant of a second conductivity type to form lightly-doped source/drain (LDD) regions 112 and 113 with low concentration in the higher concentration layer 102a. The LDD regions 112 and 113 are self-aligned with the polysilicon gate 108. For the NMOS device, the dopant is of the second conductivity type such as arsenic ions which are implanted in a dose of $1 \times 10^{14}$ to $1 \times 10^{15}$ ions/cm$^2$ at 5 KeV and an incidence angle of 0° to 7°.

Figure 1E:
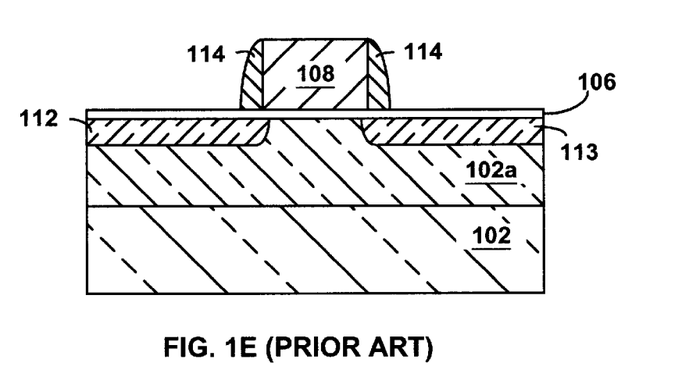

Referring now to FIG. 1E (PRIOR ART), therein is shown the formation of sidewall spacers 114 around the polysilicon gate 108.

Figure 1F:
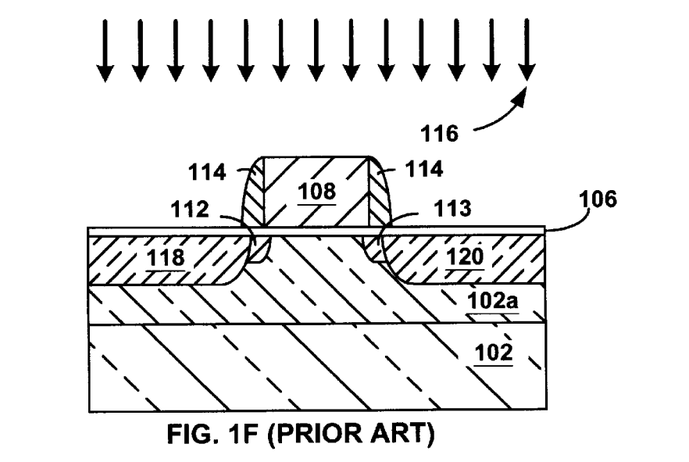

Referring now to FIG. 1F (PRIOR ART), therein is shown the ion implantation 116 of a dopant to form highly-doped source-drain regions 118 and 120 in the higher concentration layer 102a at a self-aligning position with the sidewall spacers 114. For the NMOS device, the dopant is of the second conductivity type, such as arsenic ions, which are implanted in a dose of about $2 \times 10^{15}$ ions/cm$^2$ at 5–10 KeV and an incidence angle of 0° to 7°.

Generally, the prior art techniques for threshold adjust suffer from the disadvantages of requiring high energy and high-tilt angle implants. The present invention provides a method for fabricating MOS devices which have a minimal threshold fluctuation across the semiconductor wafer so as to improve its yield, but yet permits the ability to use low energy and low-tilt angle implants.

In accordance with the principles of the present invention, a method of manufacturing a MOS device having self-compensating threshold adjust implants is provided. The present invention will now be described in detail with reference to the accompanying drawings. It should be appreciated that the drawings are in greatly simplified form. In practice, the MOS device will be one of a very large number of semiconductor devices formed on a plurality of semiconductor integrated circuit dies on a wafer in which the various MOS devices may be suitably connected in different circuit arrangements. Further, it should be clearly understood that while described herein is the method of manufacturing an N-type MOS device (NMOS), the present invention is equally applicable to fabrication of opposite conductivity type devices (e.g., p-type MOS devices or PMOS).

With particular reference to FIGS. 2A through 2H, there are illustrated the manufacturing steps for fabricating an NMOS device with self-compensating threshold adjust implants, according to the present Invention.

Figure 2A:
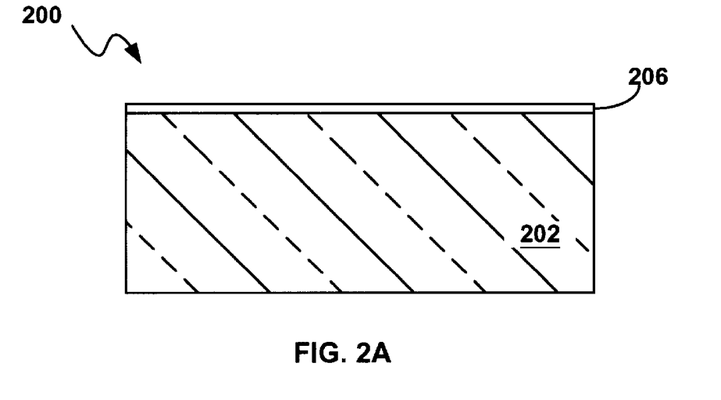
FIGS. 2A through 2H illustrate the sequence of process steps of a process for forming a MOS device with self-compensating threshold implants in accordance with the principles of the present invention.

Referring to FIG. 2A, therein is shown a cross-section of a semiconductor 200 in an intermediate stage of processing. At this stage is shown a silicon substrate 202 with a layer of gate oxide 206 formed on the surface of silicon substrate 202.

Figure 2B:
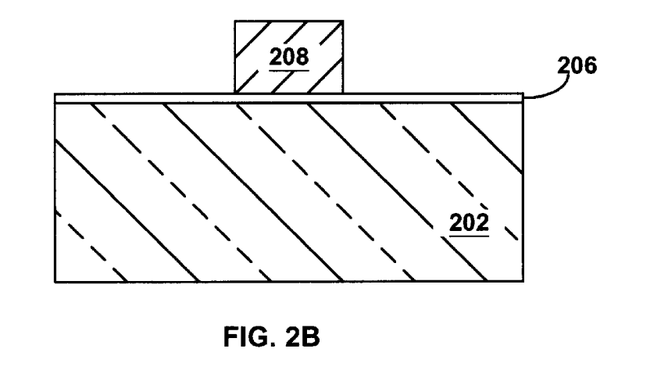

Referring now to FIG. 2B, therein is shown the silicon substrate 202 after the conventional step of polysilicon deposition and polysilicon gate pattern and etch to form a polysilicon gate 208 on the silicon substrate 202 over the gate oxide 206.

Figure 2C:
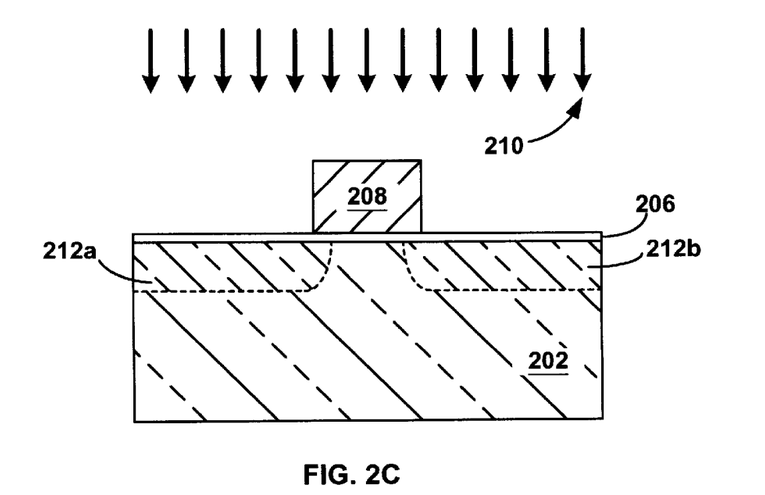

Referring now to FIG. 2C, therein is shown the ion implantation (threshold adjust-implant) 210 of a dopant through the gate oxide 206 to form p$^+$ implant or self-compensating regions 212a and 212b. The dopant may be B or $BF_2$, and is implanted at a dose of approximately $1 \times 10^{13}$ to $8 \times 10^{13}$ ions/cm$^2$ at an energy, which is not smaller than that which is sufficient to introduce significant fraction of the total dose into the silicon substrate and which is not excessively high so as to avoid a peak doping too far below the surface of the substrate, such as of about 2–5 KeV. Preferably, the dose is about $5 \times 10^{13}$ ions/cm$^2$. The tilt angle is also preferably in the range from 0° to 7°. For an incidence angle larger than 0°, the wafer is preferably rotated during the implant to avoid a beam shadowing effect produced by the gate. It will be noted that unlike the prior art techniques, the self-compensating implant is performed after the gate is deposited, patterned and etched, without utilizing high-tilt angle and high energies. In this manner, the peak of the lateral doping is maintained relatively close to the surface of the silicon substrate 202.

Figure 2D:
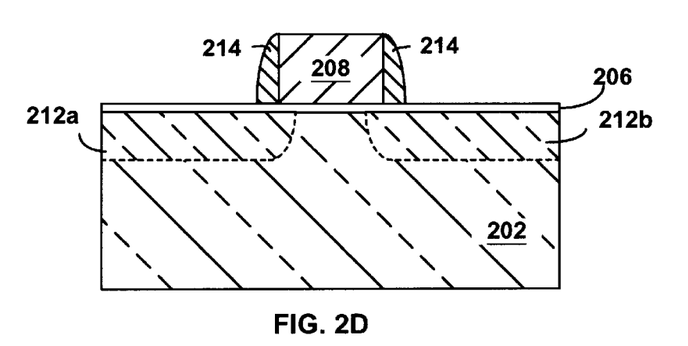

Referring now to FIG. 2D, therein is shown the formation of disposable sidewall spacers 214 around the polysilicon gate 208. Sidewall spacers 214 may be formed of a material such as silicon nitride.

Figure 2E:
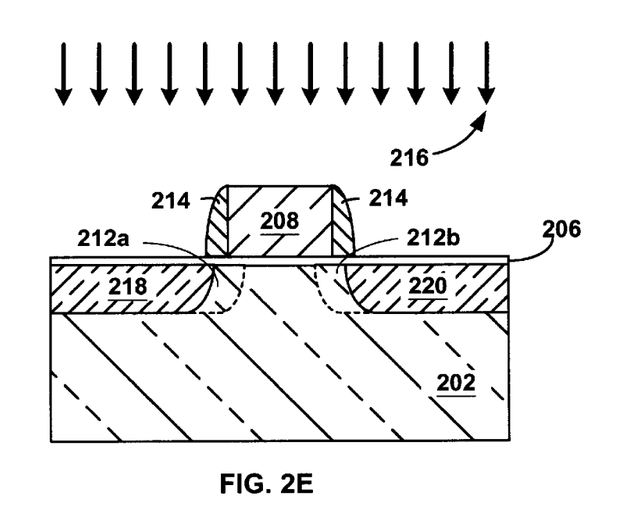

Referring now to FIG. 2E, therein is shown the ion implantation 216 of a dopant at a high concentration to form highly-doped source/drain regions 218 and 220 in the self-compensating regions 212a and 212b. The highly-doped source/drain regions 218 and 220 are formed at a self-aligning position with the sidewall spacers 214. The dopant is of the second conductivity type such as arsenic ions, which are implanted in a dose of about $2\times10^{15}$ ions/cm$^2$ at 5–10 KeV and an incidence angle of 0°–7°. The highly-doped source region 218 and self-compensating region 212a (and similarly highly-doped drain region 220 and self-compensating region 212b) completely overlap except underneath the sidewall spacers 214. The highly-doped source region 218 completely engulfs the self-compensating region 212a left from the sidewall spacers 214. Similarly, the highly-doped drain region 220 completely engulfs the self-compensating region 212b right from the sidewall spacers 214. It is well known that there is a PN junction (not shown) formed between the highly-doped source region 218 and substrate 202 (and the highly-doped drain region 220 and substrate 202) since these two regions contain dopant of different types. Similarly, there is a PN junction (not shown) formed between the highly-doped drain region 220 and substrate 202. Underneath the sidewall spacers 214 there exists the relatively large concentration of dopant forming the self-compensating region 212a unaffected by the highly-doped source region 218 since the highly-doped source region 218 was masked by the sidewall spacers 214.

Figure 2F:
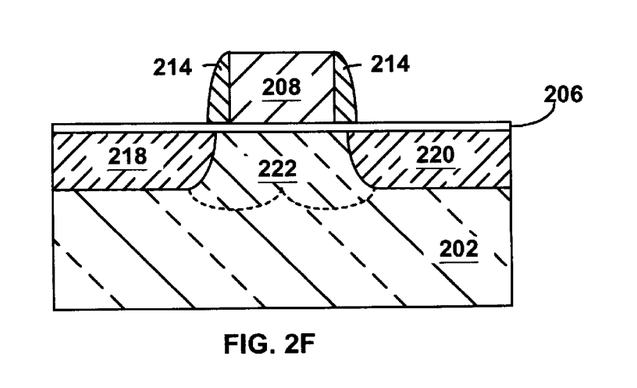

Referring now to FIG. 2F, therein is shown the rapid thermal anneal (RTA) of the silicon substrate 202, in order to activate the self-compensating regions 212a and 212b, and the highly-doped source/drain regions 218 and 220. The RTA process causes the dopant within the self-compensating regions 212a and 212b to diffuse laterally to create "pockets" 222 from each side of the polysilicon gate 208. In the RTA process, the silicon substrate 202 is preferably heated for a time period of 5–30 seconds and at a temperature from 900° C. to 1050° C. Alternatively, a low temperature furnace anneal may be performed from 700° C. to 850° C. for 5–15 minutes. In this fashion, the dopant of the self-compensating regions 212a and 212b is driven underneath the gate area. The PN junction formed between the highly-doped source region 218 and substrate 202 (and similarly between highly-doped drain region 220 and substrate 202) is characterized by the high electric field in their vicinity, preventing the dopant forming the self-compensating region 212a to diffuse or "escape" beyond the junction. This is true despite the fact that the dopant forming the self-compensating region 212a (B) diffuses much faster than the dopant forming the highly-doped source region 218 (As). However, the portion of the self-compensating region 212a that is underneath the sidewall spacers 214 (and likewise for self-compensating region 212b) can diffuse to form the pocket 222. The lateral doping slope of the self-compensating regions 212a and 212b and subsequently annealed doping profile will cause the channel doping level to change. The effect of electric field on co-diffusion of the two different dopants (B and As) will be illustrated in FIGS. 3A and 3B.

Figure 2G:
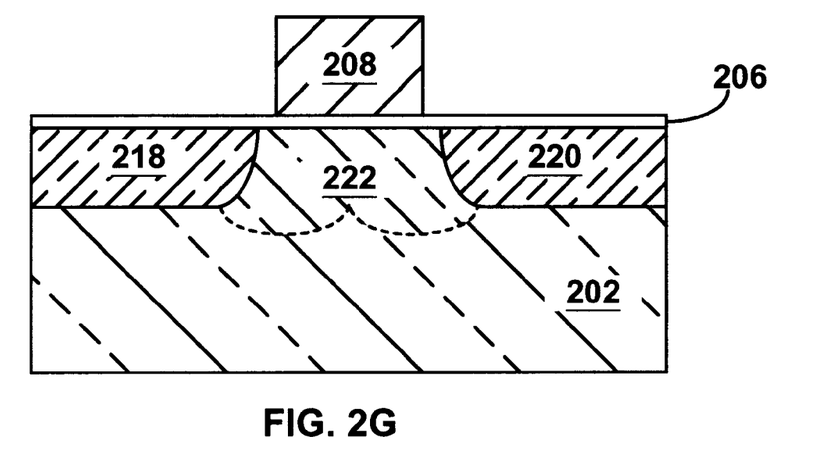

Referring now to FIG. 2G, therein is shown the removal of the sidewall spacers 214 using a conventional isotropic etching process.

Figure 2H:
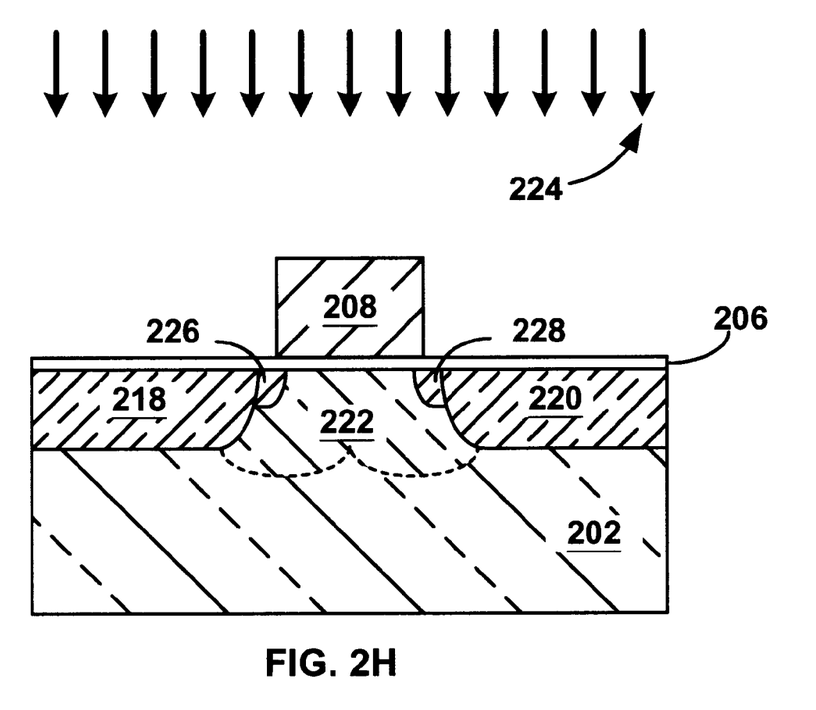

Referring now to FIG. 2H, therein is shown the ion implantation 224 of a dopant to form lightly doped source/drain (LDD) regions 226 and 228 with low concentration in respective pockets 222 on each side of the polysilicon gate 208. The dopant is of a second conductivity type such as arsenic ions and is implanted in a dose of $5\times10^{14}$ to $1\times10^{15}$ ions/cm$^2$ at 5 KeV and an incidence angle of 0°. After ion implantation of the LDD regions 226 and 228, the silicon substrate 202 is subject to a very short RTA to activate the dopant.

After the short RTA, the substrate 202 will be processed through the conventional process of silicidation to form metallic salicide in the areas where a subsequently deposited metallic layer contacts exposed doped regions such as highly-doped source/drain regions 218 and 220, or polysilicon gate 208.

Figure 3A:
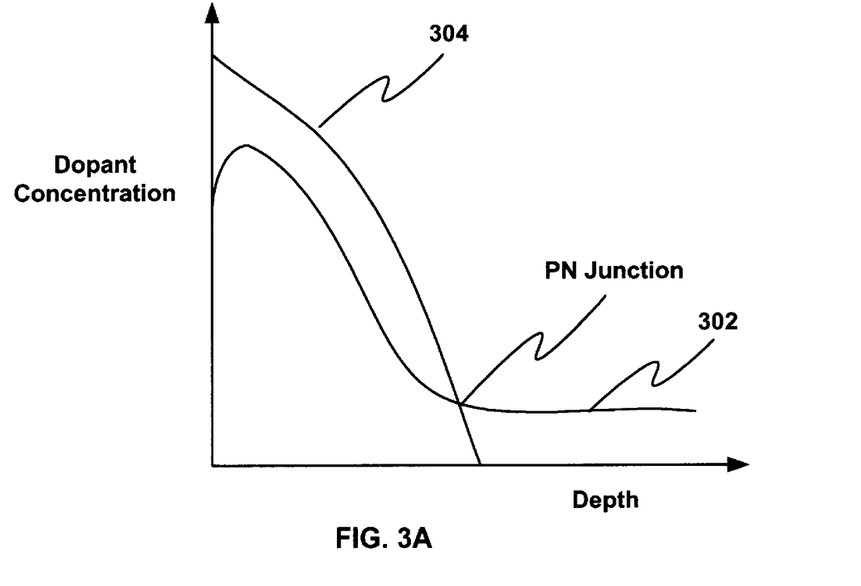
FIGS. 3A and 3B are graphical representations showing the effect of an electric field on co-diffusion of two different dopants: arsenic (As) and boron (B)
Figure 3B:
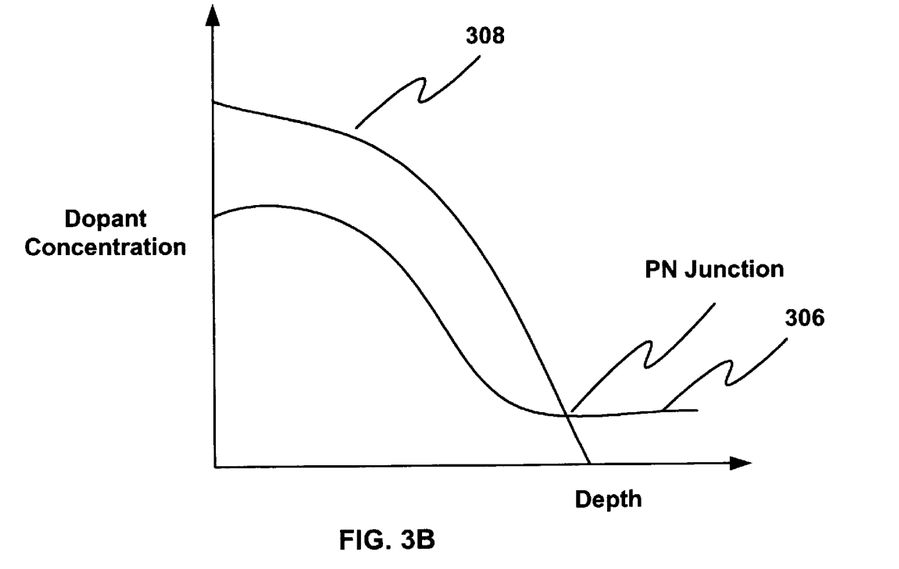

FIGS. 3A and 3B show the effect of electric field on co-diffusion of two different dopants: As and B.

Referring now to FIG. 3A, therein is shown a graphical representation of the dopant concentration as a function of depth in the silicon substrate 202 for the self-compensating region 212a (curve 302) and the highly-doped source region 218 (curve 304) prior to the RTA. The intersection of curves 302 and 304 is the location of the PN junction formed between the highly-doped source region 218 and the substrate 202.

Referring now to FIG. 3B, therein is shown a graphical representation of the dopant concentration as a function of depth in the silicon substrate 202 for the self-compensating region 212a (curve 306) and the highly-doped source region 218 (curve 308) after the RTA. Similarly, the intersection of curves 306 and 308 is the location of the PN junction formed between the highly-doped source region 218 and the silicon substrate 202.

Figure 4A:
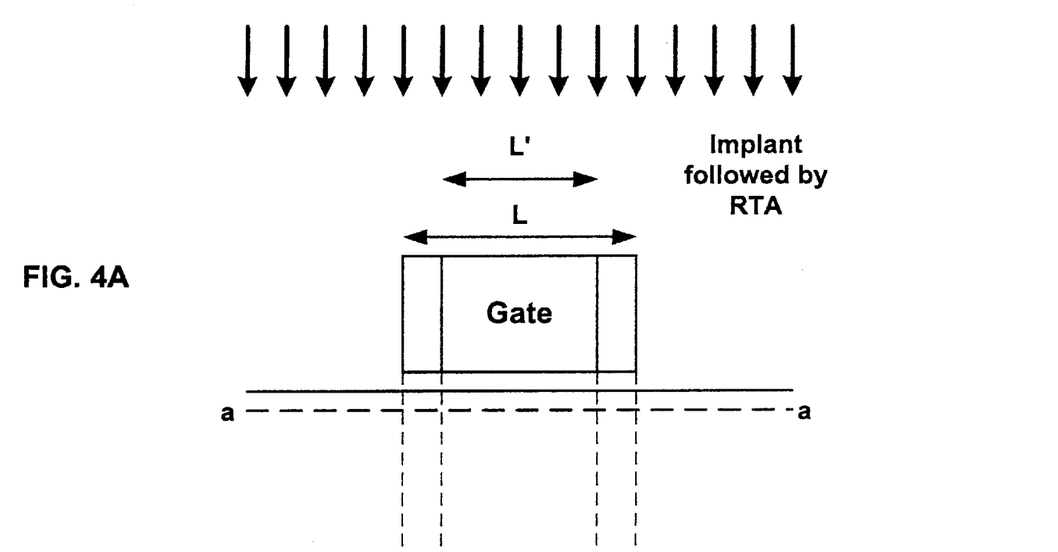
FIG. 4A is a graphical representation of two MOS devices having different gate lengths formed in accordance with the present invention.

Referring now to FIG. 4A, therein is shown a graphical representation of two MOS devices having different gate lengths (L>L') in which the self-compensating implant step of the present invention is applied. Since the MOS device having the shorter gate length L' will have a lower threshold voltage $V_T$, the present invention serves to change or raise its threshold voltage $V_T$ so as to match the MOS device having the longer gate length L by increasing the doping in the channel area. As a result, the MOS device with the shorter gate length L' will have more channel doping while the MOS device with the longer gate length L will have less channel doping so as to minimize the $V_T$ fluctuation.

Figure 4B:
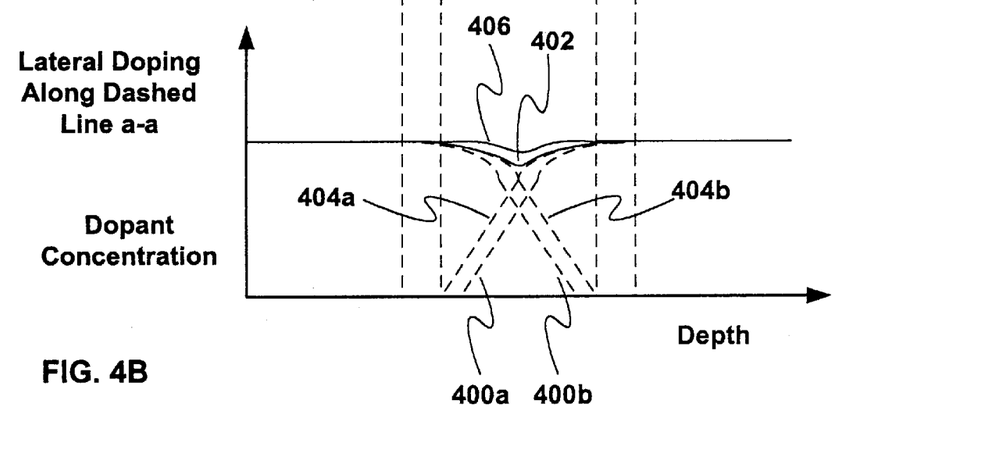
FIG. 4B is a graph of dopant concentration in the channel region of the MOS devices of FIG. 4A.

The present invention allows tracking automatically of the channel doping of the MOS device as a gate length is varied due to process variations. In other words, the shorter gate length device will be compensated in terms of the threshold voltage by the addition of doping into the channel. The present invention is achieved automatically since the channel doping tracks the gate length. This result can be best understood by reference to FIG. 4B which is a graph of the dopant concentration in the channel region of the two MOS devices of FIG. 4A. The curves 400a and 400b are the two lateral doping profiles along the dash line a—a (FIG. 4A) for the MOS device having the longer gate length L, and the curve 402 is its resultant profile obtained by addition of the curves 400a and 400b. Similarly, the curves 404a and 404b are the two lateral doping profiles along the dash line a—a (FIG. 4A) for the MOS device having the shorter gate length L', and the curve 406 is its resultant profile obtained by addition of the curves 404a and 404b. By comparing the curve 406 with the curve 402, it can be observed that the channel doping profile for the MOS device with shorter gate length L' is higher than the one for MOS device with the longer gate length L, thereby maintaining the threshold voltage $V_T$ substantially the same.

Accordingly, the present invention serves to raise the $V_T$ of a MOS device fabricated with a shorter gate length so as to match the threshold voltage of another MOS device having a longer gate length by increasing the doping in the channel area. As a result, the MOS device with the shorter gate length will have more channel doping (which raises the $V_T$), while the MOS device with the longer gate length will have less channel doping (which does not raise the $V_T$) so as to minimize the $V_T$ fluctuation within a manufacturing process. Further, the present invention provides a MOS device which has improved saturation current $I_{SAT}$ characteristics as well as reduced drain and source junction capacitances thereby rendering faster switching speeds.

In this embodiment, the LDD regions 226 and 228 are formed after the formation of the self-compensating regions 212a and 212b, the highly-doped source/drain regions 218 and 220, and the subsequent RTA of the silicon substrate 202. Specifically, the highly-doped source/drain regions 218 and 220 are formed prior to the RTA of the silicon substrate 202 to diffuse and drive the self-compensating regions 212a and 212b underneath the polysilicon gate 208. If the self-compensating regions 212a and 212b are diffused (thus avoiding the need for disposable sidewall spacers 214) before the formation of the highly-doped source/drain regions 218 and 220, there will be no impurity locking effect so that the self-compensating regions 212a and 212b will diffuse vertically as well. As a result, there will be an increase in doping underneath the source and drain regions that leads to the undesirable increase in PN junction (formed between highly-doped junction 218 or 220, and the substrate 202) capacitance. The increase in PN junction capacitance is undesirable because it reduces the switching speed of the device. By forming the highly-doped source/drain regions 218 and 220 prior to the RTA of the silicon substrate 202 to diffuse and drive the self-compensating regions 212a and 212b in accordance with the present invention, the highly-doped source/drain regions 218 and 220 effectively prevent the vertical diffusion of the self-compensating regions 212a and 212b beyond the PN junctions during the subsequent RTA. Therefore, increase in PN junction capacitance due to the vertical diffusion of the self-compensating regions is minimized.

In production, the gate oxide 206 is formed to a thickness of approximately 25 Å on the silicon substrate 202 of the semiconductor 200 by thermal oxidation at about 800° C., as shown in FIG. 2A. Thereafter, a layer of polysilicon is grown thereon in a thickness of approximately 1500 Å by a chemical vapor deposition (CVD) process. Sequentially, the polysilicon layer 116 is subjected to a well-known photolithography and etching process to form the polysilicon gate 208 on the gate oxide 206, as shown in FIG. 2B. It should be apparent to those skilled in the art that after the gate etch, the remaining gate oxide 206 not covered by the polysilicon gate 208 may also be etched, and a new oxide is then grown which oxidizes the gate electrode as well. This new oxide thus formed is typically somewhat thicker than the gate oxide 206.

Next, the threshold adjust-implant 210 is performed to form $p^+$ implant or self-compensating regions 212a and 212b, as shown in FIG. 2C. The dopant may be B or $BF_2$. Preferably, the dose is about $5 \times 10^{13}$ ions/cm$^2$. The tilt angle is also preferably in the range from 0° to 7°. The implant energy is preferably in the range of 3–15 KeV.

Next, disposable sidewall spacers 214 are formed around the polysilicon gate 208 using a conventional CVD process followed by etching, as shown in FIG. 2D.

Following the formation of the sidewall spacers 214, highly-doped source/drain regions 218 and 220 are formed in the self-compensating regions 212a and 212b by ion implantation 216, as shown in FIG. 2E. The highly-doped source/drain regions 218 and 220 are formed at self-aligning position with the sidewall spacers 214. The dopant is of the second conductivity type such as arsenic ions, which are implanted in a dose of about $2 \times 10^{15}$ ions/cm$^2$ at 5–10 KeV and an incidence angle of 0°–7°.

After ion implantation of the highly-doped source/drain regions 218 and 220, the silicon substrate 202 is subject to an RTA to activate and diffuse the self-compensating regions 212a and 212b, to dope the polysilicon forming the polysilicon gate 208, and to activate the highly-doped source/drain regions 218 and 220, as shown in FIG. 2F. The RTA process causes the dopant within the self-compensating regions 212a and 212b to diffuse laterally to create "pockets" 222 from each side of the polysilicon gate 208. The silicon substrate 202 is preferably heated for a time period of 5 to 30 seconds and at a temperature from 900° C. to 1050° C. Alternatively, a low temperature furnace anneal may be performed from 700° C. to 850° C. for 5–15 minutes. In this fashion, the dopant of the self-compensating regions 212a and 212b is driven underneath the polysilicon gate area.

Next, the sidewall spacers 214 are removed using a conventional isotropic etching process.

After the removal of the sidewall spacers 214, LDD regions 226 and 228 with low concentration are formed in respective pockets 222 on each side of the polysilicon gate 208 by ion implantation 224, as shown in FIG. 2H. The dopant is of a second conductivity type such as arsenic ions and is implanted in a dose of $5 \times 10^{14}$ to $1 \times 10^{15}$ ions/cm$^2$ at 5 KeV and an incidence angle of 0°–7°. However, if the incidence angle is more than 0°, the silicon substrate 202 must be rotated during the ion implantation to avoid shadowing. Although shadowing is not critical for the implantation of the highly doped source/drain regions, it is very critical for the ion implantation of LDD and self-compensating regions.

After the ion implantation of the LDD regions 226 and 228, the silicon substrate 202 is subject to a very short RTA to activate the dopant. In the RTA process, the silicon substrate 202 is preferably heated for a time period of 5 to 15 seconds and at a temperature of about 1000° C. This short RTA will not cause excessive diffusion of any dopant present in the substrate 202.

Next, the formation of non-removable spacers around the polysilicon gate 208 using a conventional CVD process followed by etching is done followed by the deposition of a metallic layer, and then the thermal annealing of the substrate 202 to form metallic salicide in the areas where the metallic layer contacts exposed doped regions such as highly-doped source/drain regions 218 and 220, or polysilicon gate 208.

As can be seen from above, the present invention allows tracking automatically of the channel doping of the MOS device as a gate length is varied due to process variations. In other words, the shorter gate length device will be compensated in terms of the threshold voltage by the addition of doping into the channel. The present invention is achieved automatically since the channel doping tracks the gate length.

From the foregoing detailed description, it can thus be seen that the present invention provides a MOS device with self-compensating threshold adjust implants and a method of manufacturing the same. This is achieved by a threshold implant performed after the gate has been deposited, patterned and etched. As a result, the lateral slope of the second threshold implant and subsequently annealed doping profile will change the channel doping level so as to automatically track the gate length. The present invention does not use high energy and large-tilt angle implants. Furthermore, by forming the highly-doped source/drain regions prior to the RTA of the silicon substrate to diffuse and drive the self-compensating regions, the present invention also minimizes the problem associated with the increase in junction capacitance due to vertical diffusion of channel doping.

While the best mode does not include a threshold adjust implant step prior to the deposition of the gate polysilicon, it should be understood that the present invention is applicable to include such a threshold adjust implant step prior to the deposition of the gate polysilicon. In this case, the threshold adjust implant may be performed at a reduced dose compared to the prior art, that is, at a dose of less than approximately $8 \times 10^{12}$ ions/cm$^2$ and at an energy of about 5–15 KeV.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of fabricating a MOS device having self-compensating implant regions, comprising the steps of:
   providing a semiconductor substrate of a first conductivity type;
   forming a gate oxide layer on a surface of said semiconductor substrate;
   forming a gate on a surface of said gate oxide layer;
   performing a first implant with a dopant of said first conductivity type to form self-compensating implant regions in said semiconductor substrate on opposite sides of said gate;
   forming disposable sidewall spacers around said gate;
   performing a second implant with a dopant of a second conductivity type to form highly-doped source/drain regions in said self-compensating implant regions on opposite sides of said gate;
   heating said semiconductor substrate to cause lateral diffusion of said self-compensating implant regions under said gate to define pockets;
   removing said disposable sidewall spacers; and
   performing a third implant with a dopant of said second conductivity type to form lightly-doped source/drain regions in said pockets on opposite sides of said gate.

2. The method as claimed in claim 1 wherein the step of performing said first implant with a dopant of said first conductivity type is performed at an energy from about 2 to 5 KeV.

3. The method as claimed in claim 1 wherein the step of performing said first implant with a dopant of said first conductivity type is performed at a dose of about $1 \times 10^{13}$ to $8 \times 10^{13}$ ions/cm$^2$.

4. The method as claimed in claim 1 wherein the step of heating said semiconductor substrate includes rapid thermal annealing of said semiconductor substrate for a period of 5 to 30 seconds and at a temperature from 900° to 1050° C.

5. The method as claimed in claim 1 wherein the step of heating said semiconductor substrate includes low temperature furnace annealing of said semiconductor substrate for a period of 5 to 15 minutes at a temperature from 700° to 850° C.

6. The method as claimed in claim 1 wherein:
   said first conductivity type is a p conductivity type; and
   said second conductivity type is an n conductivity type.

7. The method as claimed in claim 1 wherein the step of performing said first implant with a dopant of said first conductivity type is performed with a material selected from a group consisting of boron and a boron-containing material.

8. The method as claimed in claim 1 wherein:
   said first conductivity type is an n conductivity type; and
   said second conductivity type is a p conductivity type.

9. The method as claimed in claim 1 wherein the step of performing said first implant with a dopant of said first conductivity type is performed with a material selected from a group consisting of phosphorus and arsenic.

10. A method of fabricating a MOS device having self-compensating implant regions, comprising the steps of:
    providing a semiconductor substrate of a first conductivity type;
    forming a gate oxide layer on a surface of said semiconductor substrate;
    forming a gate on a surface of said gate oxide layer;
    performing a first implant with a dopant of said first conductivity type at an energy from about 2 to 5 KeV to form self-compensating implant regions in said semiconductor substrate on opposite sides of said gate;
    forming disposable sidewall spacers around said gate;
    performing a second implant with a dopant of a second conductivity type to form highly-doped source/drain regions in said self-compensating implant regions on opposite sides of said gate;
    heating said semiconductor substrate to cause lateral diffusion of said self-compensating implant regions under said gate to define pockets;
    removing said disposable sidewall spacers; and
    performing a third implant with a dopant of said second conductivity type to form lightly-doped source/drain regions in said pockets on opposite sides of said gate.

11. The method as claimed in claim 10 wherein the step of performing said first implant with a dopant of said first conductivity type is performed at a dose of about $1 \times 10^{13}$ to $8 \times 10^{13}$ ions/cm$^2$.

12. The method as claimed in claim 10 wherein the step of heating said semiconductor substrate includes rapid thermal annealing of said semiconductor substrate for period of 5 to 30 seconds and at a temperature from 900° to 1050° C.

13. The method as claimed in claim 10 wherein the step of heating said semiconductor substrate includes low temperature furnace annealing of said semiconductor substrate for a period of 5 to 15 minutes at a temperature from 700° to 850° C.

14. The method as claimed in claim 10 wherein:
    said first conductivity type is a p conductivity type; and said second conductivity type is an n conductivity type.

15. The method as claimed in claim 10 wherein the step of performing said first implant with a dopant of said first conductivity type is performed with a material selected from a group consisting of boron and a boron-containing material.

16. The method as claimed in claim 10 wherein:
   said first conductivity type is an n conductivity type; and
   said second conductivity type is a p conductivity type.

17. The method as claimed in claim 10 wherein the step of performing said first implant with a dopant of said first conductivity type is performed with a material selected from a group comprising phosphorus and a phosphorus-containing material.

18. A method of fabricating a MOS device having self-compensating implant regions, comprising the steps of:
   providing a semiconductor substrate of a p conductivity type;
   forming a gate oxide layer on a surface of said semiconductor substrate;
   forming a gate on a surface of said gate oxide layer;
   performing a first implant with a material selected from a group consisting of boron and a boron-containing material at a dose of about $1\times10^{13}$ to $8\times10^{13}$ ions/cm$^2$ and at an energy of about 2 to 5 KeV to form self-compensating implant regions in said semiconductor substrate on opposite sides of said gate;
   forming disposable sidewall spacers around said gate;
   performing a second implant with a dopant of an n conductivity type to form highly-doped source/drain regions in said self-compensating implant regions on opposite sides of said gate;
   heating said semiconductor substrate to cause lateral diffusion of said self-compensating implant regions under said gate to define pockets, wherein the step of heating said semiconductor substrate includes rapid thermal annealing of said semiconductor substrate for a period of 5 to 30 seconds and at a temperature from 900° to 1050° C.;
   removing said disposable sidewall spacers; and
   performing a third implant with a dopant of said n conductivity type to form lightly-doped source/drain regions in said pockets on opposite sides of said gate.

* * * * *